(12) United States Patent
Agrawal et al.

(10) Patent No.: US 12,063,033 B2
(45) Date of Patent: Aug. 13, 2024

(54) APPARATUS FOR MULTI-DRIVER ARCHITECTURE WITH HIGH VOLTAGE PROTECTION AND IMPEDANCE CONTROL

(71) Applicant: Renesas Electronics America Inc., Milpitas, CA (US)

(72) Inventors: Vikas Agrawal, San Jose, CA (US); Feng Qiu, Fremont, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 4 days.

(21) Appl. No.: 17/540,683

(22) Filed: Dec. 2, 2021

(65) Prior Publication Data

US 2023/0032010 A1    Feb. 2, 2023

Related U.S. Application Data

(60) Provisional application No. 63/227,676, filed on Jul. 30, 2021.

(51) Int. Cl.
*H03K 17/687* (2006.01)
(52) U.S. Cl.
CPC ............................. *H03K 17/6872* (2013.01)
(58) Field of Classification Search
CPC .................................................. H03K 17/6872
See application file for complete search history.

(56) References Cited

U.S. PATENT DOCUMENTS

| | | | | |
|---|---|---|---|---|
| 9,407,268 B1* | 8/2016 | Hsu | ................ | H03K 19/018528 |
| 11,281,034 B2* | 3/2022 | Tsuchi | ................ | G09G 3/3614 |
| 2003/0001611 A1* | 1/2003 | Dour | .................. | H03K 19/0005 |
| | | | | 326/30 |
| 2004/0145358 A1* | 7/2004 | Rogers | ..................... | G05F 1/46 |
| | | | | 323/267 |
| 2004/0222821 A1* | 11/2004 | Ho | ........................ | H04L 25/028 |
| | | | | 327/65 |
| 2007/0139123 A1* | 6/2007 | Liu | ....................... | G11C 7/1051 |
| | | | | 330/302 |
| 2018/0130508 A1 | 5/2018 | Das et al. | | |
| 2020/0044616 A1 | 2/2020 | Hollis et al. | | |

FOREIGN PATENT DOCUMENTS

WO    WO-2015170845 A1 *  11/2015    ......... H03K 19/0175

OTHER PUBLICATIONS

EP Search dated Nov. 24, 2022 received in EP Patent Application No. 22178284.0.

* cited by examiner

*Primary Examiner* — Metasebia T Retebo
(74) *Attorney, Agent, or Firm* — SCULLY, SCOTT, MURPHY & PRESSER, P.C.

(57) ABSTRACT

Apparatuses, systems, and methods for implementing a multi-driver architecture are described. The multi-driver architecture may include a first driver and a second driver configured to receive an input voltage. A predriver logic circuit may select one of the first driver and the second driver to convert the input voltage into an output voltage. A controller may be connected to the first driver and the second driver, and a switch may be connected between an output terminal of the first driver and the controller. The controller may be configured to control an internal resistance of the switch. In response to the first driver being selected by the predriver logic circuit, the first driver may output the output voltage at a constant impedance level.

20 Claims, 5 Drawing Sheets

APPARATUS FOR MULTI-DRIVER ARCHITECTURE WITH HIGH VOLTAGE PROTECTION AND IMPEDANCE CONTROL

CROSS-REFERENCE TO RELATED APPLICATION

This application claims the benefit of U.S. Provisional Application No. 63/227,676 filed on Jul. 30, 2021. The entire content of U.S. Provisional Application No. 63/227,676 is incorporated herein by reference.

TECHNICAL FIELD

The present disclosure relates in general to apparatuses and systems that utilizes differential output drivers. In particular, the present disclosure relates to differential output drivers that may drive another circuit using output voltages with constant impedance.

BACKGROUND

A driver circuit (or driver) can be used for controlling another circuit by regulating current flowing into the circuit being controlled. For example, a transistor driver can be implemented as a current amplifying device that receives an input current from a low current source (e.g., a logic gate or a sensor) and drives the input current to a higher current that can be used for driving circuits or components such as bulbs and motors. In another example, a driver can regulate an input voltage and use the regulated voltage to drive or control another component. In another example, a computing device may use a clock generator that includes a plurality of output drivers. The clock generator can receive an input clock signal, and the plurality of drivers can drive the input clock signal to a higher current to drive different components or applications being implemented in the computing device.

SUMMARY

In an embodiment, an apparatus for implementing a multi-driver architecture is generally described. The apparatus may include a controller configured to control an internal resistance of a driver circuit to cause the driver to output an output voltage at a constant impedance level.

In an embodiment, an apparatus for implementing a multi-driver architecture is generally described. The apparatus may include a first driver configured to receive an input voltage. The apparatus may further include a second driver configured to receive the input voltage. The apparatus may further include a predriver logic circuit configured to select one of the first driver and the second driver to convert the input voltage into an output voltage. The apparatus may further include a controller connected to the first driver and the second driver. The apparatus may further include a switch connected between an output terminal of the first driver and the controller. The controller may be configured to control an internal resistance of the switch. In response to the first driver being selected by the predriver logic circuit, the first driver may output the output voltage at a constant impedance level.

In an embodiment, a system for implementing a multi-driver architecture is generally described. The system may include a circuit and an apparatus connected to the circuit. The apparatus may include a first driver configured to receive an input voltage. The apparatus may further include a second driver configured to receive the input voltage. The apparatus may further include a predriver logic circuit configured to select one of the first driver and the second driver to convert the input voltage into an output voltage. The apparatus may further include a controller connected to the first driver and the second driver. The apparatus may further include a switch connected between an output terminal of the first driver and the controller. The controller may be configured to control an internal resistance of the switch to select one of the first driver and the second driver to convert the input voltage into an output voltage. In response to the first driver being selected by the predriver logic circuit, the first driver may output the output voltage at a constant impedance level. The output voltage may be provided to the circuit without using a termination resistor external to the apparatus and to the circuit.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

In an aspect, a differential output driver may be implemented as an amplitude regulated voltage source that is regulated through the measurement of a common mode voltage. The differential output driver may output the regulated voltage to another circuit or component to control or drive the circuit or component. In an aspect, impedance matching can prevent current from flowing back into the driver due to impedance difference. For example, a termination resistor (e.g., external to the differential output driver) may be connected between a differential output (e.g., a true output and a complimentary output) of the differential output driver to perform impedance matching. In an aspect, a voltage at a center tap of the termination resistor may be measured, and the measured voltage may be provided as feedback to a regulator that implements the amplitude regulation on the output voltage. Application specific output driver requirements to maintain tradeoff between power and noise performance may be addressed by configuring or designing the differential output driver to include multiple features for balancing power and noise performances. However, the cost to produce the differential output drivers may increase as the number of features increases. Due to the relatively high cost, some differential output drivers may be designed or configured to require relatively lower performance specifications.

The apparatuses, systems, and methods described herein may address various issues relating to application specific output driver requirements such as noise performance across multiple driver types irrespective of a supply voltage within a specific range (e.g., from 1.8 volts (V) to 3.3 volts). Further, the apparatuses, systems, and methods described herein may provide relatively smaller footprint to improve cost, and may maintain a tradeoff between power and noise performance. In an example, the apparatuses, systems, and methods described herein may allow multiple driver types with programmable voltage levels to co-exist together and improve performance levels in terms of noise and signal profile, and may be realized with smaller footprint. Furthermore, one or more switches (e.g., N-type metal-oxide-semiconductors with relatively thick gate) may be controlled by an impedance control logic block to provide constant impedance levels across multiple supply voltages. The constant impedance level across multiple supply voltages may allow the differential output driver to function without a termination resistor. A removal of the termination resistor may reduce the amount of components occupying a circuit board, and may reduce footprint on the circuit board.

Figure 1:
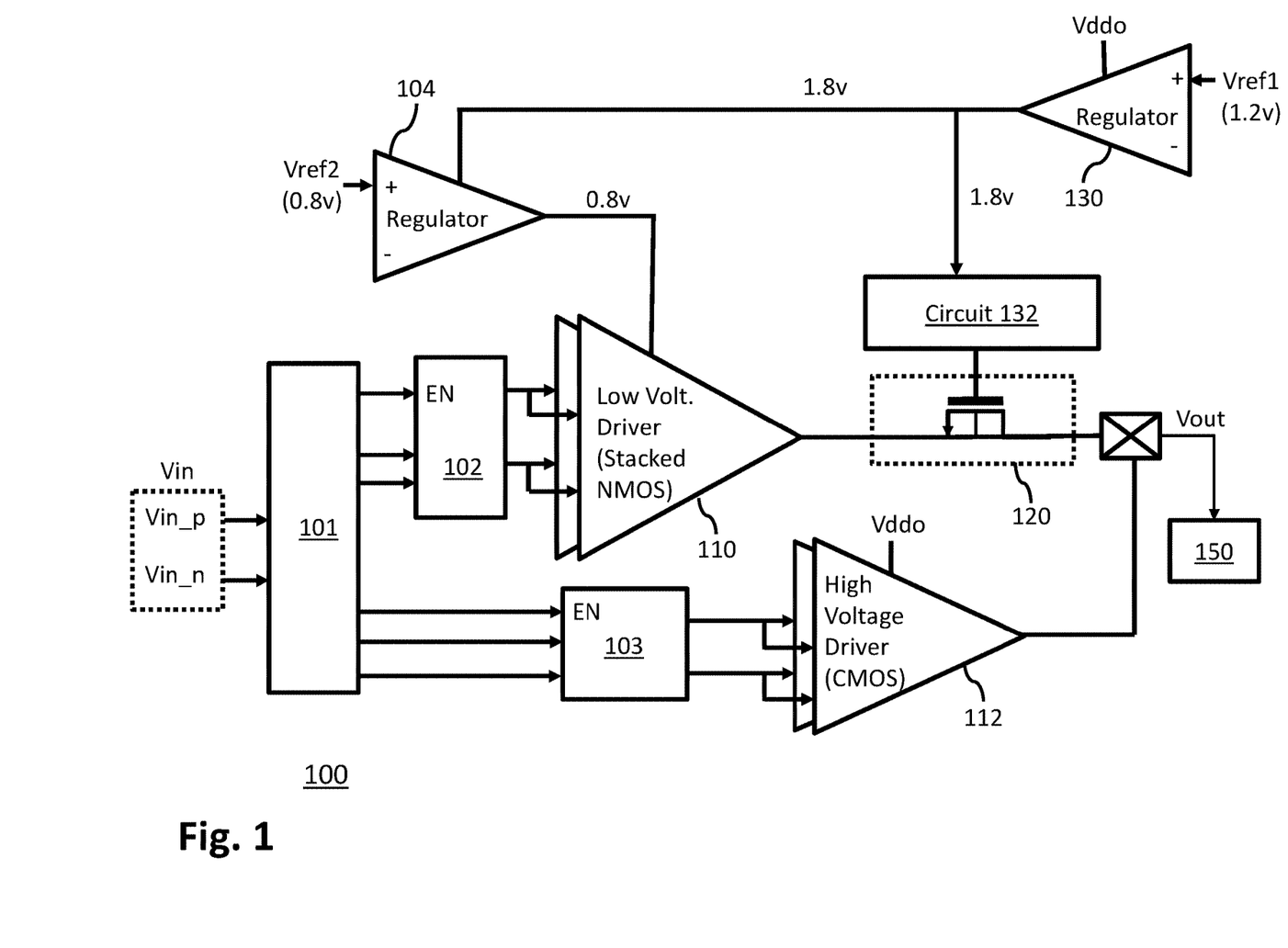
FIG. 1 is a diagram showing an example apparatus that can implement multi-driver architecture with high voltage protection and impedance control in one embodiment.

FIG. 1 is a diagram showing an example apparatus 100 that may implement multi-driver architecture with high voltage protection and impedance control in one embodiment. In an example, the apparatus 100 may be an integrated circuit being implemented as a driver or a buffer within an electronic device. The apparatus 100 can receive an input signal, such as an input voltage Vin, and convert Vin into an output signal, such as an output voltage Vout. The apparatus 100 may use the output voltage signal Vout to drive another circuit or component, such as a circuit 150. In the example shown in FIG. 1, the apparatus 100 may include a circuit 101, a predriver circuit 102, a predriver circuit 103, a voltage regulator 104, a driver 110, a driver 112, another voltage regulator 130, a circuit 132 ("control logic block 132"), and a switch 120. In one embodiment, the circuit 101, the predriver circuit 102, the predriver circuit 103, the driver 110, and the driver 112 may form a driver circuit of the apparatus 100, and the voltage regulator 104, the voltage regulator 130, the circuit 132, and the switch 120 may form a control block or a controller of the apparatus 100. The circuit 101 of the apparatus 100 may receive different voltage signals as inputs, such as the input voltage signal Vin, where Vin may be a differential input having a true component and a complimentary component (e.g., Vin_n and Vin_p). The circuit 101 may include predriver logic configured to select one of the predriver circuits 102, 103, and may perform a level shift on the input voltage signal Vin to bring a voltage level of Vin to a suitable level for either the driver 110 or the driver 112. For example, the circuit 101 may level shift Vin to a first voltage level if Vin is being provided to the predriver circuit 102 and the driver 110, or the circuit 101 may level shift Vin to a second voltage level if Vin is being provided to the predriver circuit 103 and the driver 112. In an example, the second voltage level may be greater than the first voltage level. In one example embodiment, the second voltage level may be equivalent to a supply voltage Vddo being provided to the apparatus 100, where Vddo can vary between 1.8V to 3.3V, and the first voltage level may be 1.8V.

The predriver circuits 102, 103 may receive level shifted voltages from the circuit 101 and may optimize noise performance across multiple supply voltages, such as voltage signals being outputted by the drivers 110, 112, respectively, with lower area requirements. The driver 110 may be a low voltage driver having a stacked N-type metal-oxide-semiconductor (NMOS) configuration, and the driver 110 may be configured to supply a voltage having the first voltage level (e.g., 0.8V regulated by the voltage regulator 104). In one embodiment, the driver 110 may implement a low power high speed current steering logic (LP-HCSL). Note that using the stacked NMOS topology with the predriver circuit 102 configured at 1.8 volts may reduce an overall area requirement for low voltage drivers (e.g., driver 110). The driver 112 may be a high voltage driver having a complementary-symmetry metal-oxide-semiconductor (CMOS) configuration (e.g., having a p-type metal-oxide-semiconductor (PMOS) stacked with an NMOS), and the driver 112 may operate using the supply voltage Vddo). The apparatus 100 may be configured to meet a specific process, voltage and temperature variation specifications along with improved power supply noise rejection.

In an example, the voltage regulator 130 may receive a reference voltage Vref1 (e.g., 1.2V) and may convert Vref1 into a constant voltage, such as 1.8V. The voltage regulator 130 may provide the constant voltage to the voltage regulator 104 and to the control logic block 132. The voltage regulator 130 may operate based on the supply voltage Vddo. The constant voltage outputted by the voltage regulator 130 may be a supply voltage for the voltage regulator 104 and the control logic block 132. The voltage regulator 104 may receive a reference voltage Vref2 and may convert Vref2 into an amplitude control voltage (e.g., 0.8V) that may be used for controlling an amplitude of voltage signals being outputted by the driver 110. In an example, the reference voltage Vref2 may be programmable and may vary between 0.4V to 1.0V. The programmable reference voltage Vref2 may allow a voltage swing of the voltage signals being outputted by the driver 110 to be programmable.

In an example, the switch 120 may include one or more switching elements (e.g., transistors such as N-type metal-oxide-semiconductor field-effect transistors (MOSFETs)) connected in parallel. Each one of the switching elements among the switch 120 may have its bulk or body terminal of the switch 120 connected to its source terminal to reduce threshold voltage of the switching element and improve signal integrity. The switching elements in the switch 120 may be selectively enabled (or switched on), or disabled (or switched off), by the control logic block 132. The control logic block 132 may be a controller, or a digital control block, configured to output digital signals representing a constant voltage that may be used for controlling the switch 120. For example, the control logic block 132 may output a first digital signal representing a first constant voltage that may enable a first number of switching elements in the switch 120, or may output a second digital signal representing a second constant voltage that may enable a second number of switching elements in the switch 120. The number of switching elements enabled in the switch 120 may be referred to as a switch size.

By using the voltage regulator 130 to supply a fixed or constant voltage to the control logic block 132, the control logic block 132 may set the switch impedance of the switch 120 by setting the switch size of the switch 120. The constant switch impedance may provide a fixed or constant impedance level across different components in the apparatus 100, or multiple values of supply voltages (e.g., Vddo). The constant impedance set by the switch 120 can cause the output of the apparatus, Vout, to have constant impedance as well. In an example, the first number of switching elements enabled may provide a constant switch impedance of 85 ohms, and the second number of switching elements enabled may provide a constant switch impedance of 100 ohms. The selection of the switch size may adjust an internal resistance of the switch 120, effectively controlling an internal resistance of the apparatus 100. For example, as the number of enabled switching elements in the switch decreases, an internal resistance of the switch 120 may increase. The internal resistance of the switch may be adjusted or increased, based on the number of enabled switching elements. The internal resistance of the switch may be increased to a specific level such that the apparatus 100 may generate differential outputs (e.g., Vout) that supports source termination at a specific impedance level. The output voltage Vout with constant impedance can allow the apparatus 100 to drive the circuit 150 without connecting external termination resistors between the differential output lines of the apparatus 100. In one embodiment, the output voltage Vout can have a fixed impedance (e.g., 85 ohms or 100 ohms) that was set by the switch size, such that there is no need to connect any termination resistor for impedance matching. In one embodiment, more than two impedance levels can be set by the switch size of the switch 120. In one embodiment, Vout can be a differential clock signal in response to the apparatus 100 being implemented in a output driver circuit of a clock generator.

In an example, the switch 120 may be disabled or switched off (e.g., all switching elements disabled) while the driver 112 can be enabled and driver 110 can be disabled. In response to enabling the driver 112 and disabling the driver 110, the apparatus 100 may operate under normal conditions (e.g., without using the switch to set the constant impedance). In response to the switch 120 being enabled or switched on (e.g., having one or more switching elements enabled), the driver 110 can be enabled and the driver 112 can be disabled. Thus, either one of the drivers 110 or 112 may be selected as a driver path to buffer or pass the input voltage Vin to another device as an output voltage Vout. In one embodiment, the circuit 101 can be configured to send an enable signal to an enable pin (EN) of one of the predriver circuits 102, 103, to enable one of the predriver circuits 102, 103. The predriver among predriver circuits 102, 103 that did not receive the enable signal is then disabled. In an example embodiment, the switching elements in the switch 120 may be thick gate NMOS protection switches that may allow feasibility of integrating multiple input-output (IO) driver types (e.g., low voltage driver such as driver 110 and high voltage driver such as driver 112). If the gate of the switching elements in the switch 120 is relatively thin, relatively higher voltages such as 3.3V may break the switching elements. By using a thicker gate NMOS to implement the switch 120, additional high voltage protection switch requirements may be eliminated thus preserving circuit board space and reducing design complexity. In an example, a thickness of the gate of the switching elements in the switch 120 may be a thickness that may tolerate a voltage of at least 3.3V.

Figure 2:
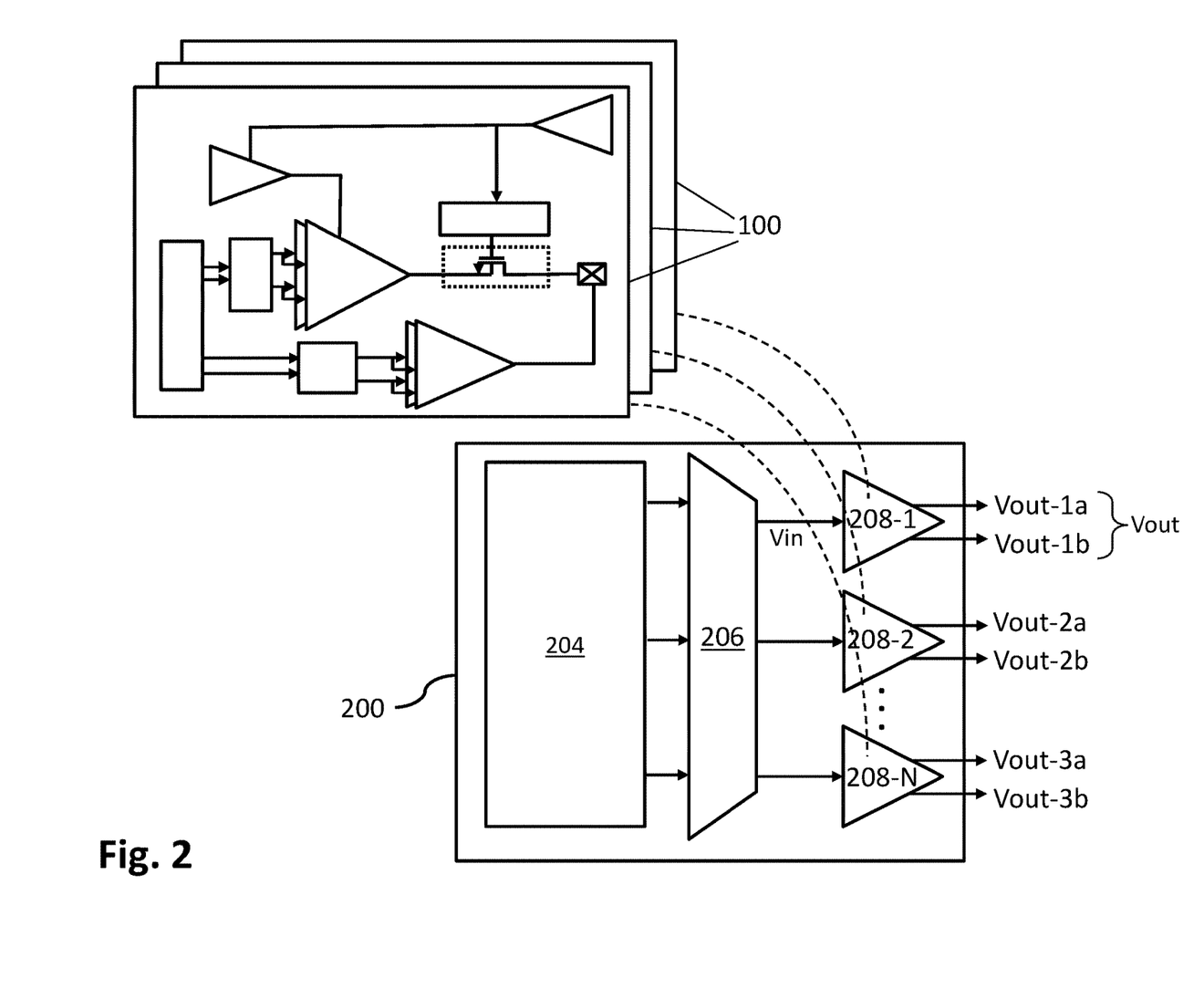
FIG. 2 is a diagram showing another example apparatus that can implement multi-driver architecture with high voltage protection and impedance control in one embodiment.

FIG. 2 is a diagram showing another example apparatus 200 that can implement multi-driver architecture with high voltage protection and impedance control in one embodiment. In an example shown in FIG. 2, the apparatus 200 may be a device including N differential output drivers, such as 208-1, 208-2, . . . 208-N. The differential output drivers of the apparatus 200 may output differential output voltage signals, such as Vout-1 from the differential output driver 208-1, where Vout-1 may include a true component Vout-1a and a complimentary component Vout-1b. In an example, N may be 12 such that the apparatus 200 may have 12 differential outputs. In another example, N may be 8 such that the apparatus 200 may have 8 differential outputs.

The apparatus 200 may further include a circuit 204 and a multiplexer 206. The circuit 204 may include components relating to an application of the apparatus 200. For example, if the apparatus 200 is a clock generator, then the circuit 204 may include oscillators, output dividers, memory devices, etc. Further, the apparatus 200 may include additional input and output pins or terminals that may not be shown in FIG. 2. Each one of the differential output drivers 208-1, 208-2, . . . 208-N may include the apparatus 100. The multiplexer 206 may be configured to select one or more of the differential output drivers 208-1, 208-2, . . . 208-N to drive the voltage Vin to Vout. For example, if the multiplexer 206 selected the differential output drivers 208-1 and 208-2, the differential output drivers 208-1 and 208-2 may drive Vin to Vout. In an example, if the apparatus 200 is a clock generator, the multiplexer 206 may be configured to select one channel from output dividers among the circuit 204 to send a clock signal to one of the differential output drivers 208-1, 208-2 . . . 208-N, where all drivers can be enabled to output the required clock signals from different channels. In one embodiment, each one of the drivers 208-1, 208-2, . . . 208-N may be connected to its own supply voltage (e.g., Vddo in FIG. 1). Further, each one of the drivers 208-1, 208-2, . . . 208-N can include a respective set of voltage regulators.

Figure 3:
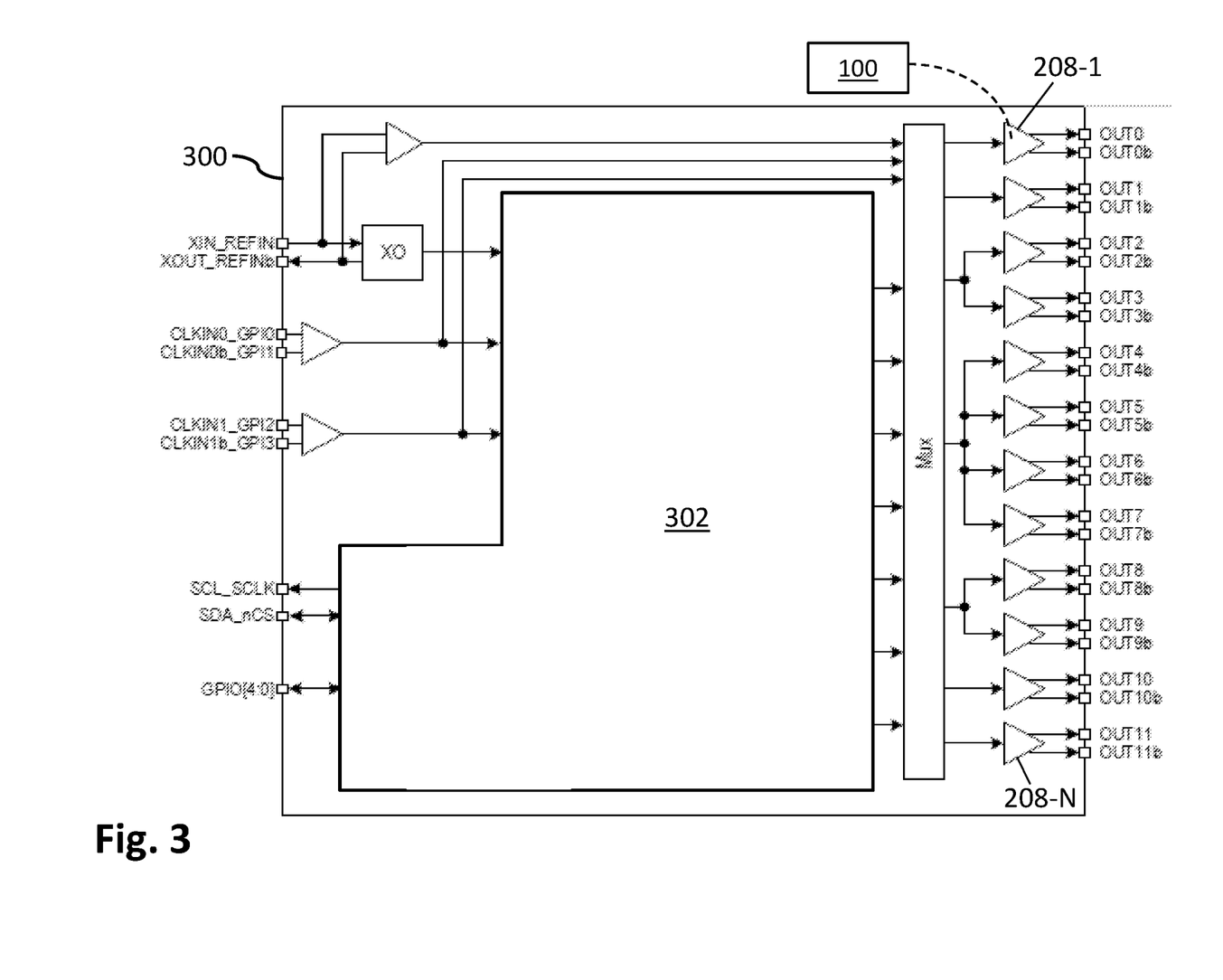
FIG. 3 is a diagram showing another example apparatus 300 that can implement multi-driver architecture with high voltage protection and impedance control in one embodiment.

FIG. 3 is a diagram showing another example apparatus 300 that can implement multi-driver architecture with high voltage protection and impedance control in one embodiment. In an example, the apparatus 300 may be a programmable clock generator for applications such as high-end desktop (HEDT) with CPU over-clocking or consumer applications with dynamic frequency requirements. The apparatus 300 may include a circuit 302. Referring to the example in FIG. 2, the circuit 302 may be the circuit 204 shown in FIG. 2. A copy of the apparatus 100 shown in FIG. 1 can be within each one of the output drivers 208-1, . . . , 208-N connected to the differential outputs of the apparatus 300. In one embodiment, the apparatus 300 shown in FIG. 3 has twelve differential outputs ranging from a differential output (OUT0, OUT0b) to (OUT11, OUT11b). In another embodiment, the apparatus 300 may include a different number of differential outputs, such as eight differential outputs.

Each one of the differential output (OUT0, OUT0b) to (OUT11, OUT11b) may be used for driving inputs to an individual application. For example, the differential outputs of the apparatus 300 can be clock signals used for driving inputs to various applications (e.g., if the apparatus 300 is a clock generator). The differential outputs (OUT0, OUT0b) can drive inputs to a first peripheral component interconnect express (PCIe) application, and the differential outputs (OUT3, OUT3b) can drive inputs to a second PCIe application. By implementing the apparatus 100 in each one of the differential output drivers 208-1, . . . , 208-N, the apparatus 300 can generate different sets of differential outputs that has a fixed output impedance (e.g., 85 ohms or 100 ohms). The fixed output impedance of the differential outputs can allow the differential outputs to drive inputs to different applications directly (e.g., without connecting external termination resistors between the differential outputs).

Figure 4A:
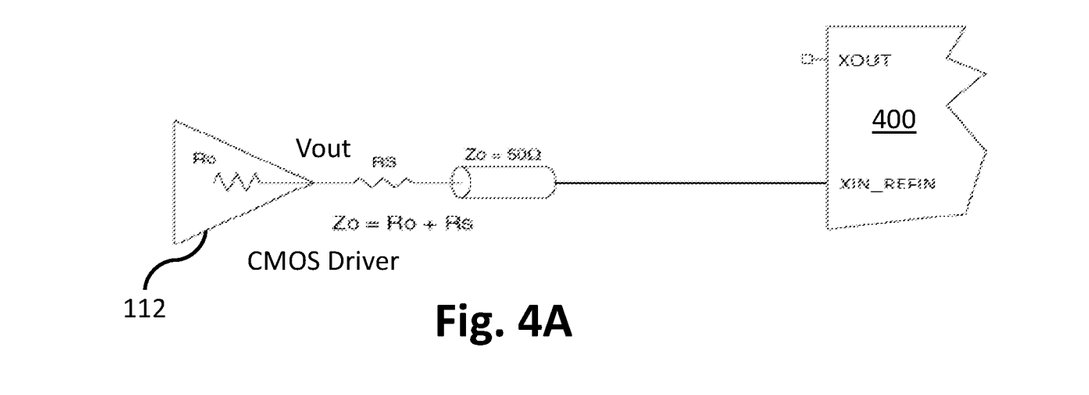
FIG. 4A is a diagram showing an example implementation of multi-driver architecture with high voltage protection and impedance control in one embodiment.
Figure 4B:
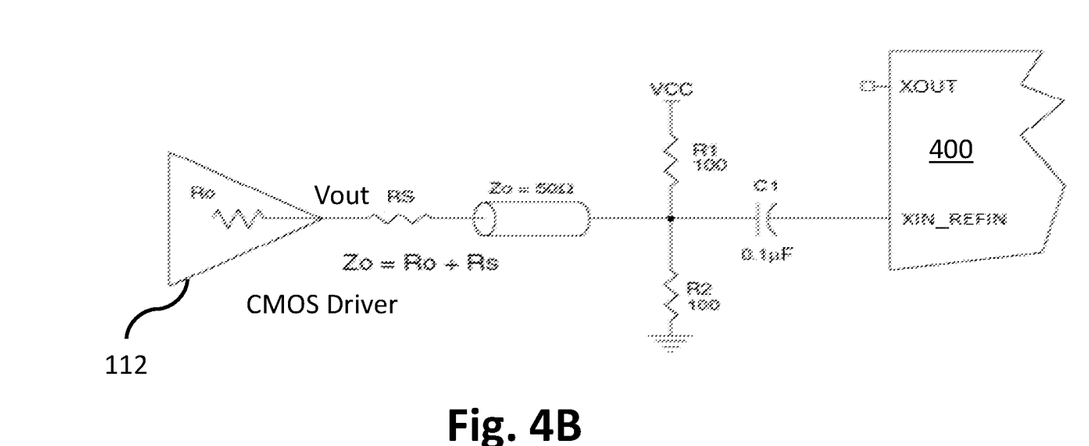
FIG. 4B is a diagram showing another example implementation of multi-driver architecture with high voltage protection and impedance control in one embodiment.

FIGS. 4A and 4B are diagrams showing example implementations of multi-driver architecture with high voltage protection and impedance control in one embodiment. FIG. 4A shows an implementation of the apparatus 100 in FIG. 1 when the driver 112 is enabled and the driver 110 is disabled. In FIG. 4A, the enabled driver 112 may output Vout to another device 400 via direct current (DC) coupling. In FIG. 4B, the enabled driver 112 may output Vout to the device 400 via alternating current (AC) coupling.

In an example, the driver 112 may process relatively higher voltage inputs (e.g., 3.3V), and the amplitude of Vout may need to be reduced from full swing to at least half the swing in order to prevent signal interference with the power rail and to reduce internal noise. For example, as shown in FIGS. 4A and 4B, the driver 112 may be implemented as a high-speed 3.3V CMOS driver. In the configurations shown in FIGS. 4A and 4B, the sum of the output impedance of the driver (Ro) and the series resistance (Rs) is equal to the transmission line impedance Zo. In addition, matched termination at a crystal input (if the apparatus 100 is implemented in a clock generator) will attenuate the signal in half. This can be done in one of two ways. First, R1 and R2 in parallel should equal the transmission line impedance. For most 50 ohm applications, R1 and R2 can be 100 ohms. Alternately, this can also be accomplished by removing R1 and changing R2 to 50 ohms. In an example, the values of the resistors can be increased to reduce the loading for a slower and weaker CMOS driver.

Figure 5A:
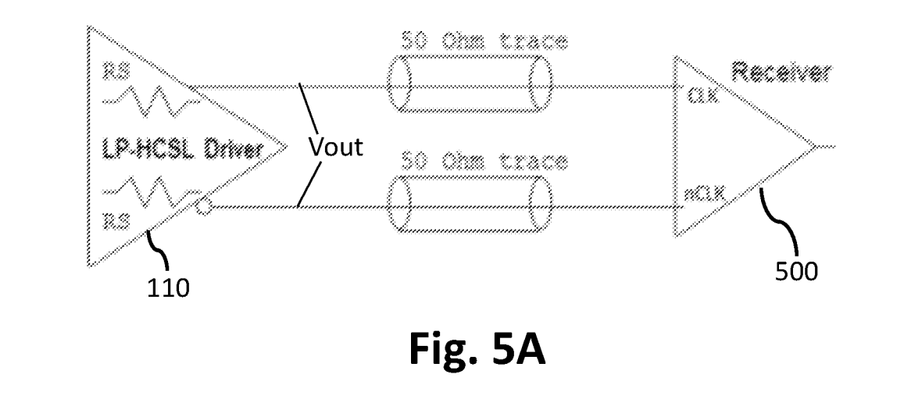
FIG. 5A is a diagram showing another example implementation of multi-driver architecture with high voltage protection and impedance control in one embodiment.
Figure 5B:
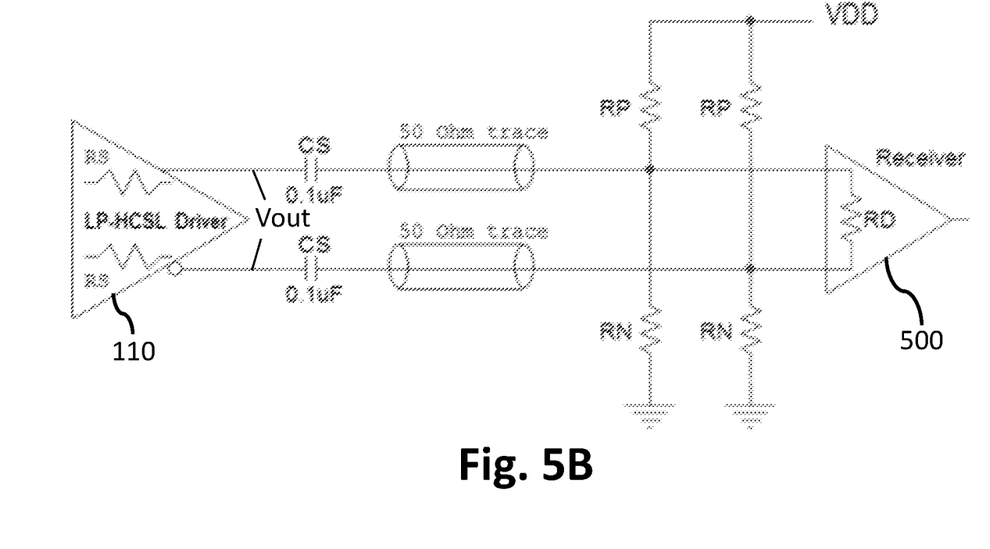
FIG. 5B is a diagram showing another example implementation of multi-driver architecture with high voltage protection and impedance control in one embodiment.

FIGS. 5A and 5B are diagrams showing example implementations of multi-driver architecture with high voltage protection and impedance control in one embodiment. FIGS. 5A and 5B show implementations of the apparatus 100 in FIG. 1 when the driver 110 is enabled and the driver 112 is disabled. In FIG. 5A, the enabled driver 110 may output Vout to another device 500 via direct current (DC) coupling. In FIG. 5B, the enabled driver 110 may output Vout to the device 500 via AC coupling. In the example shown in FIG. 5A, the driver 110 may implement a low-power high speed current steering logic (LP-HCSL) differential protocol, and the apparatus 200 shown in FIG. 2 may be a clock generator (e.g., apparatus 300 in FIG. 3) and the device 500 may be a device that operates based on a clock signal driven by Vout. The configuration shown in FIG. 5A may support source termination that presents a constant differential output impedance of, for example, 85 or 100 ohms. Note that in the example shown in FIG. 5A, no terminal resistor is connected between the different output lines (e.g., the 50 Ohm traces) of the driver 110 due to the constant differential output impedance.

FIG. 5B shows a configuration where, regardless of the protocol being implemented by the driver 110 shown in FIG. 1, AC-coupling may be used to drive the clock input pins of another device or clock generator. The configuration shown in FIG. 5B is under a 100 ohm differential transmission-line environment. In an example, the driver 110 may implement the LP-HCSL protocol for AC-coupling, with an appropriate voltage swing selection for the receiver being driven. Note that no termination resistors are needed between the driver 110 and the AC-coupling capacitors CS (e.g., there is no termination resistor connected between the differential output lines, or the two 50 Ohm traces). The resistors on the receiver side of the AC-coupling capacitors should be selected to provide an appropriate voltage bias for the particular receiver. In an example, a 100 ohm resistor across the differential pair (located near the receiver), may attenuate or prevent reflections at the receiver that may corrupt the clock signal integrity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a low-voltage driver configured to receive a low supply voltage;
a high-voltage driver configured to receive a high supply voltage that is different from the low supply voltage;
a predriver logic circuit configured to select the low-voltage driver or the high-voltage driver to convert a differential input voltage into a differential output voltage for output at an output node of the apparatus, wherein an output terminal of the high-voltage driver is connected to the output node;
a switch connected between an output terminal of the low-voltage driver and the output node; and
a controller configured to control an internal resistance of the switch such that when the low-voltage driver is selected by the predriver logic circuit and the switch is enabled, the differential output voltage is output at a constant impedance level.

2. The apparatus of claim 1, wherein the controller is further configured to control the internal resistance of the switch by selecting one of a plurality of internal resistance levels.

3. The apparatus of claim 1, wherein:
the switch comprises a plurality of switching elements; and the controller is further configured to control the internal resistance by enabling a number of the switching elements.

4. The apparatus of claim 1, wherein the switch comprises one or more N-type metal-oxide-semiconductor field-effect transistors (MOSFETs).

5. The apparatus of claim 4, where a gate thickness of the N-type MOSFETs corresponds to a supply voltage being supplied to the apparatus.

6. The apparatus of claim 1, wherein:
the low-voltage driver comprises a stacked N-type metal-oxide-semiconductor (NMOS) driver; and
the high-voltage driver comprises a complementary-symmetry metal-oxide-semiconductor (CMOS) driver.

7. The apparatus of claim 1, further comprising a low-voltage regulator with an output connected to the low-voltage driver and configured to control an amplitude of the differential output voltage when the low-voltage driver is selected by the predriver logic circuit and the switch is enabled.

8. An apparatus comprising:
a first driver configured to receive an input voltage;
a second driver configured to receive the input voltage;
a first voltage regulator;
a second voltage regulator connected to the first driver;
the first voltage regulator is configured to output a constant supply voltage to the second voltage regulator and to a controller;
the second voltage regulator is configured to control an amplitude of a voltage being outputted by the first driver;
a predriver logic circuit configured to select one of the first driver and the second driver to convert the input voltage into an output voltage, wherein the input voltage and the output voltage are differential voltage signals;
the controller connected to the first driver and the second driver; and
a switch connected between an output terminal of the first driver and the controller, wherein the controller is configured to control an internal resistance of the switch, and wherein in response to the first driver being selected by the predriver logic circuit, the first driver outputs the output voltage at a constant impedance level.

9. The apparatus of claim 8, wherein the controller is configured to adjust the internal resistance of the switch to multiple different levels to configure the first driver to output the output voltage at multiple different constant impedance levels.

10. The apparatus of claim 8, wherein the switch comprises a plurality of switching elements, and controller is configured to control the internal resistance by enabling a specific number of switching elements in the switch.

11. The apparatus of claim 8, wherein the switch includes one or more N-type metal-oxide-semiconductor field-effect transistors (MOSFETs).

12. The apparatus of claim 11, where a gate thickness of the one or more N-type MOSFETs is based on a supply voltage being supplied to the apparatus.

13. The apparatus of claim 8, wherein:
the first driver is a stacked NMOS driver; and
the second driver is a CMOS driver.

14. A system comprising:
a circuit;
a first voltage regulator;
a second voltage regulator;
an apparatus connected to the circuit, the apparatus comprises:
a first driver configured to receive an input voltage;
a second driver configured to receive the input voltage;
a predriver logic circuit configured to select one of the first driver and the second driver to convert the input voltage into an output voltage, wherein the input voltage and the output voltage are differential voltage signals;
a controller connected to the first driver and the second driver;
a switch connected between an output terminal of the first driver and the controller; and
the controller being configured to control an internal resistance of the switch, wherein:
the second voltage regulator is connected to the first driver;
the first voltage regulator is configured to output a constant supply voltage to the second voltage regulator and to the controller; and
the second voltage regulator is configured to control an amplitude of a voltage being outputted by the first driver;
in response to the first driver being selected by the predriver logic circuit, the first driver outputs the output voltage at a constant impedance level; and
the output voltage is provided to the circuit to drive the circuit directly.

15. The system of claim 14, wherein the switch includes one or more N-type metal-oxide-semiconductor field-effect transistors (MOSFETs), and a gate thickness of the one or more N-type MOSFETs is based on a supply voltage being supplied to the apparatus.

16. The system of claim 14, wherein:
the first driver is a stacked NMOS driver; and
the second driver is a CMOS driver.

17. The system of claim 14, wherein the first voltage regulator and the second voltage regulator are parts of the apparatus.

18. The apparatus of claim 1, wherein the high supply voltage is a supply voltage to the apparatus.

19. The apparatus of claim 7, further comprising a high-voltage regulator with an output connected to the low-voltage regulator and the controller.

20. The apparatus of claim 1, wherein the high supply voltage is higher than the low supply voltage.

* * * * *